(12) United States Patent
Pedrone et al.

(10) Patent No.: US 9,712,112 B1
(45) Date of Patent: Jul. 18, 2017

(54) DYNAMIC NOISE MITIGATION IN INTEGRATED CIRCUIT DEVICES USING LOCAL CLOCK BUFFERS

(71) Applicant: INTERNATIONAL BUSINESS MACHINES CORPORATION, Armonk, NY (US)

(72) Inventors: Miles C. Pedrone, Poughkeepsie, NY (US); Kirk D. Peterson, Jericho, VT (US); John E. Sheets, II, Zumbrota, MN (US); Andrew A. Turner, Underhill, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/331,403

(22) Filed: Oct. 21, 2016

(51) Int. Cl.
| | |
|---|---|
| *H03K 17/00* | (2006.01) |
| *H03B 29/00* | (2006.01) |
| *H03K 5/08* | (2006.01) |
| *H03K 5/19* | (2006.01) |
| *G01R 29/26* | (2006.01) |

(52) U.S. Cl.
CPC ............ *H03B 29/00* (2013.01); *G01R 29/26* (2013.01); *H03K 5/08* (2013.01); *H03K 5/19* (2013.01)

(58) Field of Classification Search
None
See application file for complete search history.

(56) References Cited

U.S. PATENT DOCUMENTS

| | | | |
|---|---|---|---|
| 6,933,754 B2 | 8/2005 | Restle | |
| 7,400,555 B2 * | 7/2008 | Franch | ............ G01R 31/31725 327/263 |
| 7,961,559 B2 * | 6/2011 | Dixon | ............ G01R 31/31725 327/175 |
| 8,170,146 B2 | 5/2012 | Hayem et al. | |
| 9,164,563 B2 | 10/2015 | Berry, Jr. et al. | |
| 2006/0259887 A1 * | 11/2006 | Tretz | ................... G06F 17/5036 326/38 |
| 2009/0063921 A1 * | 3/2009 | Aipperspach | .... G01R 31/31721 714/733 |
| 2014/0316725 A1 * | 10/2014 | Eckert | ...................... G06F 1/26 702/58 |

FOREIGN PATENT DOCUMENTS

KR            100936765 B1      1/2016

OTHER PUBLICATIONS

IBM, "A low-skew local clock arrangement method in a dynamic doubleprecision multiplier", Original Publication Date: Feb. 8, 2006, IP.com No. IPCOM000133771D, IP.com Electronic Publication Date: Feb. 8, 2006, 5 Pages, IP.com.

(Continued)

*Primary Examiner* — Lincoln Donovan
*Assistant Examiner* — Khareem E Almo
(74) *Attorney, Agent, or Firm* — Cantor Colburn LLP; Steven Meyers

(57) ABSTRACT

Embodiments are directed to a method of mitigating voltage noise events. The method includes detecting the presence of a voltage noise event at the integrated circuit device. Thereafter, one or more local clock buffers (LCBs) is selected for dampening. A type of dampening is selected for the LCBs. Finally, the dampening is applied to the LCB while the voltage noise event is occurring.

20 Claims, 5 Drawing Sheets

(56) References Cited

OTHER PUBLICATIONS

Kirolos, et al, "Mitigating Power-Supply Induced Delay Variations using Self Adjusting Clock Buffers", Conference Paper in Midwest Symposium on Circuits and Systems—Sep. 2008, pp. 446-449, IEEE Xplore.
Kwong, et al., "A 65 nm Sub-Vt Microcontroller With Integrated SRAM and Switched Capacitor DC-DC Converter", 2008, Journal of Solid-State Circuits, vol. 44, No. 1, Jan. 2009, pp. 115-126, IEEE.

* cited by examiner

DYNAMIC NOISE MITIGATION IN INTEGRATED CIRCUIT DEVICES USING LOCAL CLOCK BUFFERS

BACKGROUND

The embodiments described herein relate in general to the design of integrated circuit devices. More particularly, the embodiments relate to a method of using local clock buffer circuits to mitigate the effect of voltage noise on an integrated circuit device.

An integrated circuit device is a set of electronic circuits on one small chip of semiconductor material. Integrated circuit devices are used for a wide variety of electronic applications, from simple devices to the most complex computer systems. During usage, variations in power can cause local voltage noise events that affect the semiconductor device in a number of ways.

SUMMARY

Embodiments are directed to a method of mitigating voltage noise events. The method includes detecting the presence of a voltage noise event at the integrated circuit device. Thereafter, one or more local clock buffers (LCBs) is selected for dampening. A type of dampening is selected for the LCBs. Finally, the dampening is applied to the LCB while the voltage noise event is occurring.

Embodiments are further directed to an integrated circuit device. The integrated circuit device is arranged to mitigate voltage noise events. The integrated circuit device includes a detector arranged to detect the presence of a voltage noise event at the integrated circuit device. The integrated circuit device further includes a first selector arranged to select one or more local clock buffers (LCBs) for dampening. The integrated circuit device further includes a second selector arranged to select a type of dampening for the LCBs. The integrated circuit device further includes a dampener arranged to apply the dampening to the LCB while the voltage noise event is occurring.

Embodiments are further directed to a method for generating voltage noise events in an integrated circuit device. The method includes characterizing the integrated circuit device to determine regions of the integrated circuit device that are affected by each local clock buffer (LCB) in the integrated circuit device. The method further includes selecting one or more of the LCBs. The method further includes generating a voltage noise event to the selected one or more LCBs by applying control signals to the selected one or more LCBs.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

Figure 1:
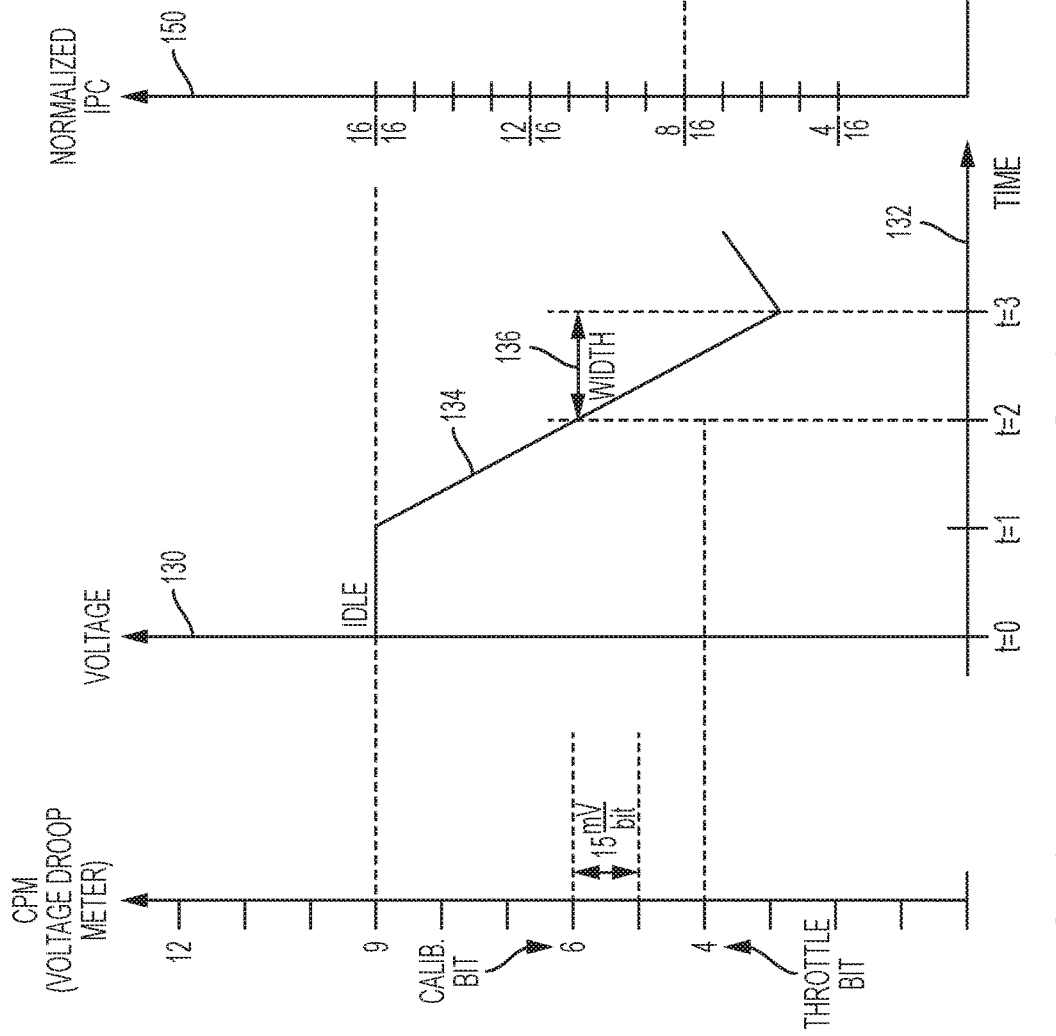
FIG. 1A depicts the operation of an exemplary voltage thermometer.
FIG. 1B depicts a graph of the output of an exemplary voltage thermometer during a voltage noise event.
FIG. 1C depicts a graph comparing instructions per second during a throttling.

In the accompanying figures and following detailed description of the disclosed embodiments, the various elements illustrated in the figures are provided with three digit reference numbers. The leftmost digits of each reference number corresponds to the figure in which its element is first illustrated.

DETAILED DESCRIPTION

Various embodiments of the present invention will now be described with reference to the related drawings. Alternate embodiments may be devised without departing from the scope of this invention. Various connections might be set forth between elements in the following description and in the drawings. These connections, unless specified otherwise, may be direct or indirect, and the present description is not intended to be limiting in this respect. Accordingly, a coupling of entities may refer to either a direct or an indirect connection.

Additionally, although a detailed description of an integrated circuit device is presented, configuration and implementation of the teachings recited herein are not limited to a particular type or configuration of integrated circuit devices. Rather, embodiments are capable of being implemented in conjunction with any other type or configuration of integrated circuit device, now known or later developed.

Traditional integrated circuit devices, such as a microprocessor, has a power input distributed throughout the integrated circuit. The power input can have variations that can negatively affect the operation of the integrated circuit. Sometimes, the variations can be caused by a power supply external to the integrated circuit device. At other times, power variations are caused by differing power needs of different regions of the integrated circuit device. A power input variation (also referred to as a voltage noise event or noise) can cause portions of the integrated circuit device to heat up. A traditional approach of reacting to such a situation is to add padding cycles or delay execution to avoid further voltage droop. Such an approach will alleviate the heating problem, but adversely affects the performance of the integrated circuit device and can lead to the ringing of the voltage noise event.

Turning now to an overview of the present invention, one or more embodiments uses local clock buffers (LCBs) in the vicinity of localized voltage noise events to dampen the voltage noise event. Once a voltage noise event has been identified, the modes of operation for affected LCBs can be switched to perform non-functional operations. Over time, the affected LCBs can be returned to normal usage. Such a scheme allows for a voltage noise event to be dissipated through multiple LCB paths, reducing the magnitude of the voltage noise event on individual LCBs. In addition, frequency and voltage guardbanding (setting a specification of an integrated circuit device) is reduced because the LCB dampening shortens the duration of the voltage noise event.

In addition, the affected LCBs and associated latches can resume full operation sooner than possible in prior technologies.

Turning now to a more detailed description of an embodiment of the present invention, the operation of several embodiments will now be described with reference to FIGS. 1A through 5.

As a preliminary matter, embodiments operate on an integrated circuit device that is divided into a plurality of regions. Each region can have a local clock buffer (LCB) that distributes and controls the clock signals to a number of transistors in the region. A larger integrated circuit device, such as a processor, can have thousands of LCBs, each affecting a small region of the integrated circuit device. There can be a clock controller that controls a plurality of LCBs.

Each of the LCBs is located near a voltage detection circuit. Exemplary voltage detection circuits can include voltage thermometers, critical path monitors (CPM) and a Skitter (Skew+jITTER) circuits. With reference to FIG. 1A through 1C, the operation of an exemplary voltage thermometer circuit will be described. With reference to FIG. 1A, a voltage thermometer circuit measures voltage, and converts that value into a number of digital bits. A voltage thermometer can be created in a variety of different manners, including the use of CPM and Skitter circuits. In a CPM circuit, there are paths that act as voltage thermometers. In a Skitter circuit, one can test how many delay stages complete in a predetermined amount of time as a way to measure a droop in voltage. In some embodiments, each "bit" of information can be equivalent to 15 mV. In other embodiments, each "bit" can represent a different voltage level. There can be a nominal voltage at the particular region that can be represented by a nominal number of bits. In FIG. 1A, the nominal idle voltage at a certain region of an integrated circuit device can by represented by 9 bits. The calibration bit can be set at 6 bits, and throttling begins at 4 bits. It should be understood these numbers are merely exemplary and the actual number of bits used can be different in different embodiments.

With respect to FIG. 1B, there is a graph of the voltage in bits (y-axis 130) versus time (x-axis 132). The measured values at a particular region of the integrated circuit device is shown as line 134. Y-axis 130 has the same scale as shown in FIG. 1A. Between time t=0 and t=1, the idle voltage is at 9 bits. Between t=1 and t=2, a voltage noise event occurs, resulting in a reduction in the voltage at this particular voltage level. If the voltage becomes less than the predetermined throttle voltage (4 bits in this example), for a predetermined amount of time (width 136 in this example), a throttle is initiated. The result of the throttle is shown in FIG. 1C.

In FIG. 1C, the instructions per cycle (y-axis 150) is plotted against time (x-axis 152). Here, the time is on the same scale as x-axis 132. Plot 160 represents the number of instructions performed per clock cycle (also known as IPC). In this case, the maximum instructions per cycle can be 16. It should be understood that this IPC is merely exemplary and any value of IPC can be used in different embodiments. The instructions per cycle remains at 16 from t=1 through t=2. By the time t=3 has passed, the voltage has been lower than the throttle voltage for the predetermined amount of time (represented by width 166). Thus, the throttling begins. In the example shown in FIG. 1C, the IPC reduces from 16 to 4. The IPC slowly rises by 1 instruction at a predetermined interval (not necessarily equal to the distance between t=2 and t=3). The reduction in IPC can be accomplished in one of a variety of different manners. In some embodiments, a NOP (no operation) instruction can be executed in place of a real instruction. The NOP instruction requires less power to perform, thus reducing the workload of the circuit in question. Referring back to FIG. 1B, it can be seen that the reduction in IPC results in the voltage rising.

In addition, by performing a NOP, some of the voltage noise event (such as the droop in the voltage illustrated in FIG. 1B) is absorbed by the circuit in question. This can result in a dampening effect on the voltage noise event. In the past, a voltage droop would rebound to normal, overshoot the nominal voltage, then droop back down below the nominal voltage, in a manner similar to that of a spring with a load. This effect takes place over time. In addition, the voltage noise event can spread to neighboring regions of the integrated circuit.

Using an LCB in the above-described manner results in a dampening of the voltage droop at a particular region of the integrated circuit device. This results in a smaller overshoot past the nominal voltage and a smaller droop back down below the nominal voltage. In addition, the spread of the voltage noise event to neighboring regions of the integrated circuit device is lessened by the dampening effect.

It should be understood that the examples shown in FIGS. 1A through 1C are merely exemplary. The voltage thermometer can have a different amount of voltage per bit. The throttle threshold can be set to any value, as can the width time used to determine if a throttle should occur and the ramp time used to set the length of time a particular IPC is used. In addition, the reduction in IPC also can be set to one of a variety of different values.

Figure 2:
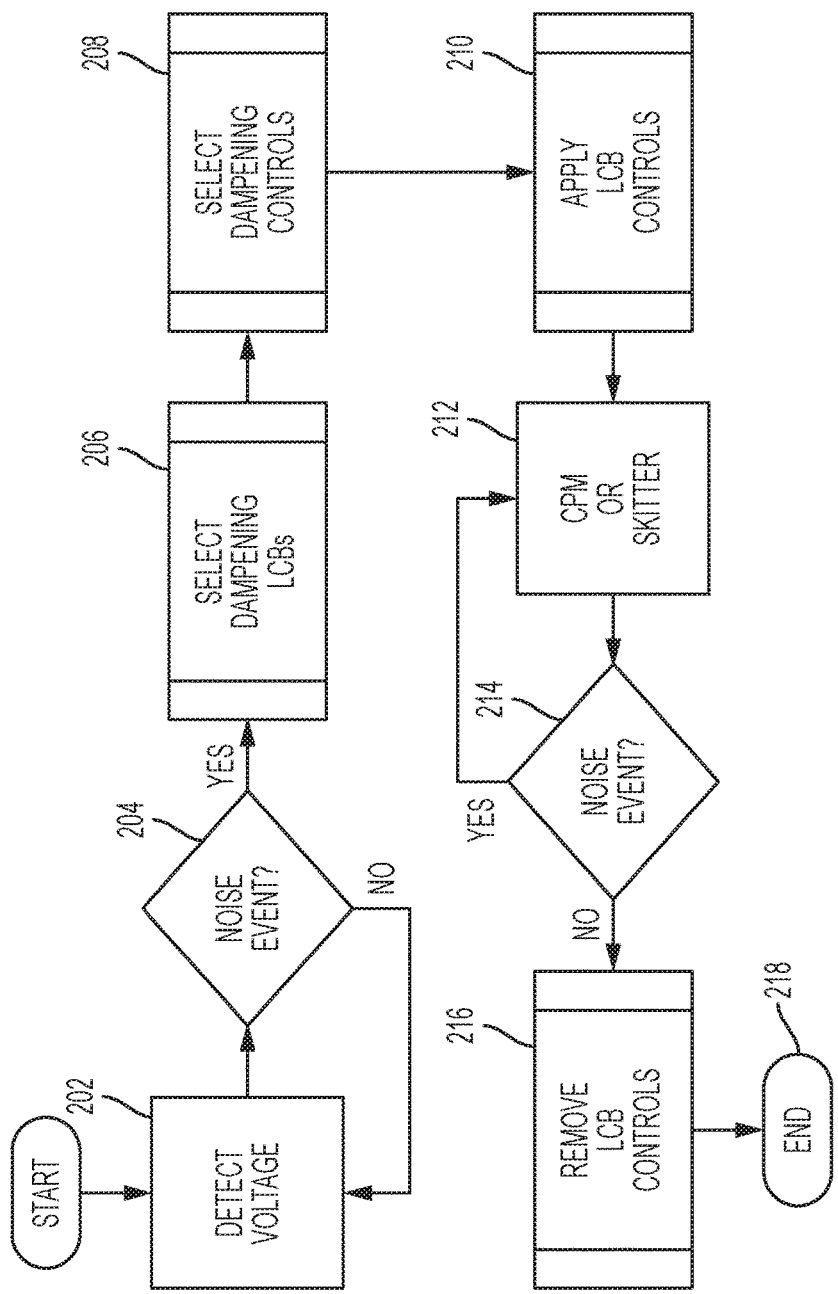
FIG. 2 depicts a flow diagram illustrating the operation of an exemplary embodiment.

A flowchart illustrating a method 200 of dealing with voltage noise in a reactionary manner is presented in FIG. 2. Method 200 is merely exemplary and is not limited to the embodiments presented herein. Method 200 can be employed in many different embodiments or examples not specifically depicted or described herein. In some embodiments, the procedures, processes, and/or activities of method 200 can be performed in the order presented. In other embodiments, one or more of the procedures, processes, and/or activities of method 200 can be combined or skipped.

Method 200 is a brief overview of an exemplary process of a reactive embodiment. Voltage is detected using a voltage detection circuit (block 202). As discussed above, one of a variety of different voltage detection circuits can be used. Exemplary voltage detection circuits include, but are not limited to, voltage thermometers, CPMs, and Skitter circuits.

After the voltage is detected, it is analyzed to determine if a voltage noise event is occurring (block 204). If not, then operation returns to the voltage detection of block 202. If there is a voltage noise event, then one or more LCBs are selected to be used with dampening (block 206).

Selecting dampening LCBs can occur in one of a variety of different manners. In some embodiments, a characterization of the integrated circuit device has been previously performed. The characterization can include exercising the integrated circuit device with a variety of different workloads. In such a manner, noise events can be tracked from front-end circuits to the LCBs that are affected. A look-up table (LUT) can be created to track the LCBs. Thereafter, upon the occurrence of a voltage noise event, the LUT is consulted to select one or more LCBs to dampen.

In other embodiments, a location-based method can be used. Such a method selects every LCB that is under the clock controller where the event was detected. As described above, an integrated circuit device can have hundreds or even thousands of LCBs. The integrated circuit device can have a plurality of clock controllers, each of which controls a plurality of LCBs. In this embodiment, the location of the clock controller can be found using the techniques described above. Thereafter, every LCB being controlled by the particular clock controller can be selected as part of block 206.

Once the one or more LCBs have been chosen, the dampening controls are selected (block 208). There can be a variety of different manners to dampen a voltage noise event. In some embodiments, each LCB in question can control a plurality of latches. The plurality of latches can be arranged in stages, sometimes referred to as the L1 stage and the L2 stage. The controls to the L1 stage can be decoupled from the controls of the L2 stage. Such a decoupling allows for non-functional switching of the L2 stage that does not affect the L1 stage and for non-functional switching of the L1 stage that does not affect the L2 stage. Either decoupling opens up a pathway for voltage noise to dissipate. In addition, a latched scan-out can be toggled or a gated device can be used on a scan-out chain to further open up a pathway for noise. The best approach for a specific integrated circuit device can be determined during system characterization. Thereafter, the selected dampening controls can be applied (block 210).

Thereafter, the detection circuits are checked (block 212) to determine if the noise event is still occurring (block 214). If so, in some embodiments, the process of blocks 206 through 210 can be repeated. In some embodiments, the existing damping controls can be maintained. If the noise event is no longer occurring, the LCB controls are removed (block 216). In some embodiments, removing the LCB controls can be a gradual process in order to minimize the effect of placing the LCB back in operation all at once. Once the LCB controls are removed, operation of the region of the integrated circuit returns to normal operation (block 218).

Figure 3:
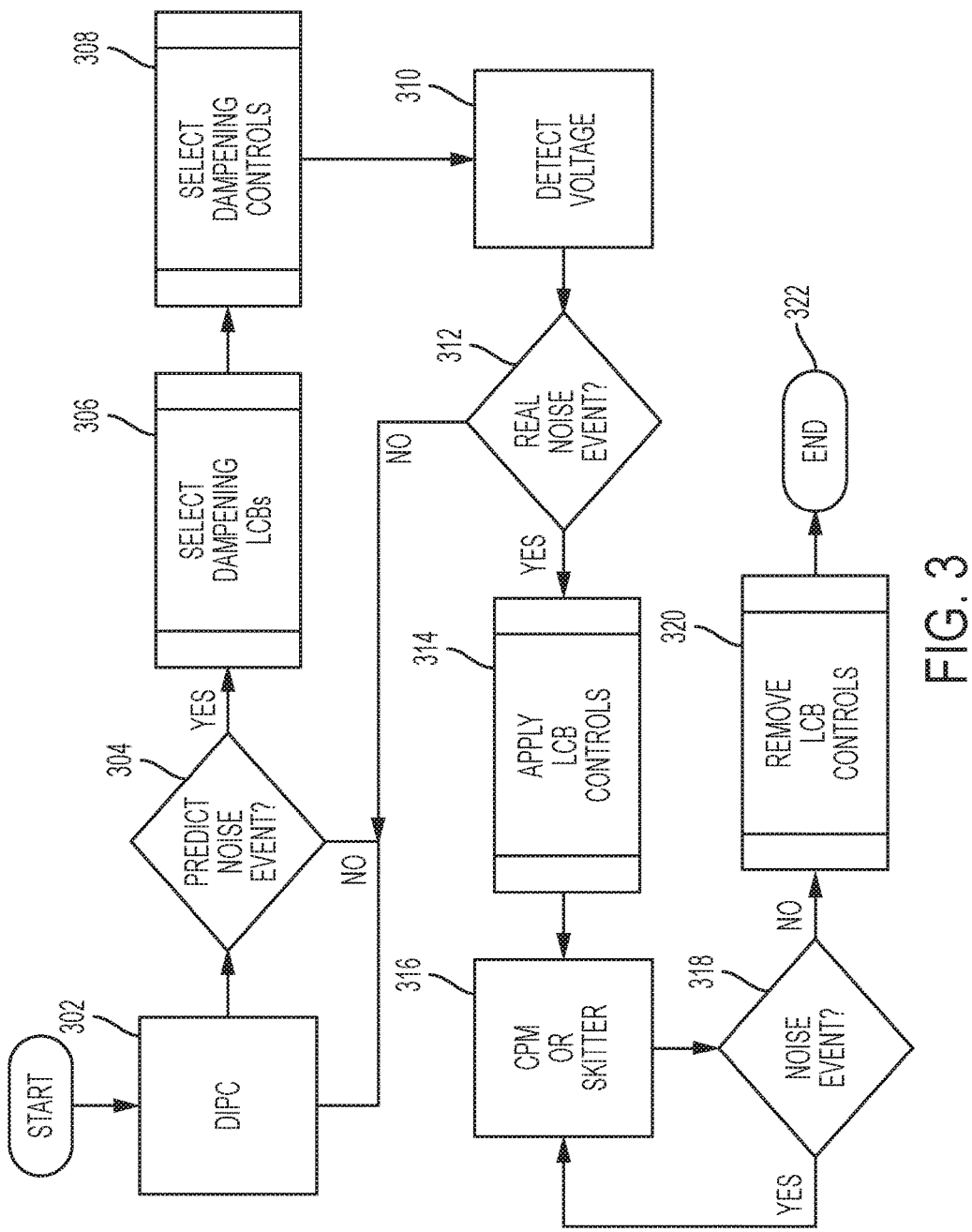
FIG. 3 depicts a flow diagram illustrating the operation of an exemplary embodiment.

In some embodiments, portions of the above-described method can be replaced with a predictive algorithm. An example of such an embodiment is illustrated in FIG. 3. A flowchart illustrating a method 300 of dealing with voltage noise in a reactionary manner is presented in FIG. 3. Method 300 is merely exemplary and is not limited to the embodiments presented herein. Method 300 can be employed in many different embodiments or examples not specifically depicted or described herein. In some embodiments, the procedures, processes, and/or activities of method 300 can be performed in the order presented. In other embodiments, one or more of the procedures, processes, and/or activities of method 300 can be combined or skipped.

Method 300 is a brief overview of an exemplary process of a predictive embodiment. A separate processor is used to analyze incoming instructions (block 302). In some embodiments, the processor can be referred to as Datahost Information Processor C (DIPC). During a characterization of an integrated circuit device, DIPC can analyze an entire instruction set and determine the power usage of each instruction and determine which regions of the integrated circuit device will be affected. Thereafter, potential noise events can be predicted based on the frequency of high-power instructions and low-power instructions (block 304). In other words, when certain commands are executed, the power draw of the integrated circuit device can be estimated. If a high-power instruction or series of instruction is detected a noise event can be predicted. Otherwise, action returns to block 302.

If there is an instruction or series of instructions that might be indicative of a voltage noise, then one or more LCBs are selected to be used with dampening (block 306).

Selecting dampening LCBs can occur in a variety of different manners. In some embodiments, a characterization of the integrated circuit device has been previously performed. The characterization can include exercising the integrated circuit device with a variety of different workloads. In such a manner, noise events can be tracked from front-end circuits to the LCBs that are affected. A look-up table (LUT) can be created to track the LCBs. Thereafter, upon the occurrence of a voltage noise event, the LUT is consulted to select one or more LCBs to dampen.

In other embodiments, a location-based method can be used. Such a method selects every LCB that is under the LCB controller where the event was detected. As described above, an integrated circuit device can have hundreds or even thousands of LCBs. The integrated circuit device can have a plurality of LCB controllers, each of which controls a plurality of LCBs. In this embodiments, the location of the LCB controller can be found using the techniques described above. Thereafter, every LCB being controlled by the particular LCB controller can be selected as part of block 306.

Once the one or more LCBs have been chosen, the dampening controls are selected (block 308). In some embodiments, the LCBs in question can control a plurality of latches. The plurality of latches can be arranged in stages, sometimes referred to as the L1 stage and the L2 stage. The controls to the L1 stage can be decoupled from the controls of the L2 stage. Such a decoupling allows for non-functional switching of the L2 stage without affecting the L1 stage and for non-functional switching of the L1 stage without affecting the L2 stage. This opens up a pathway for noise. In addition, a latched scan-out can be toggled or a gated device can be used on a scan-out chain to further open up a pathway for noise. The best approach for a specific integrated circuit device can be determined during system characterization.

Voltage is detected using a voltage detection circuit (block 310). As discussed above, a variety of different voltage detection circuits can be used. Exemplary voltage detection circuits can include CPMs (such as described above, and Skitter circuits.) While there is a prediction that a voltage noise event will occur, in some embodiments, the actual voltage is checked to determine if a voltage noise event actually happened. In some instances, even though a voltage noise event is predicted to occur, it might not actually occur. In other words, the voltage can droop, but not droop far enough (or for long enough) to be considered a voltage noise event After the voltage is detected, it is analyzed to determine if a voltage noise event is occurring (block 312). If not, then operation returns to block 302. If there is a voltage noise event, then the previously selected LCB controls are applied (block 314).

Thereafter, the detection circuits are checked (block 316) to determine if the noise event is still occurring (block 318). If so, the existing damping controls can be maintained. If the noise event is no longer occurring, the LCB controls are removed (block 320). In some embodiments, removing the LCB controls can be a gradual process in order to minimize the effect of placing the LCB back in operation all at once. Once the LCB controls are removed, operation of the region of the integrated circuit returns to normal operation (block 322).

In another embodiment, there is sometimes a desire to generate voltage noise events. One situation in which noise events are desired is during system test and characterization. As discussed above, before production of an integrated circuit device begins, a manufacturer typically wants to test the integrated circuit device under a variety of conditions.

This can be to determine the predictions discussed above with respect to FIG. 3 and to perform general stress testing under a variety of conditions. In particular, during some processor only exercises, a tester sometimes wants more voltage noise than the system develops on its own. An exemplary situation of a tester wanting more voltage noise is when a core of a processor is being tested. In a multi-core processor, the tester knows that instructions being processed in one core can affect a different core. That can be difficult to test for when testing each core individually.

In some embodiments, using the static LCBs described above, one also can generate voltage noise to provide a more realistic or challenging environment for the experiment, simulation, or characterization.

Figure 4:
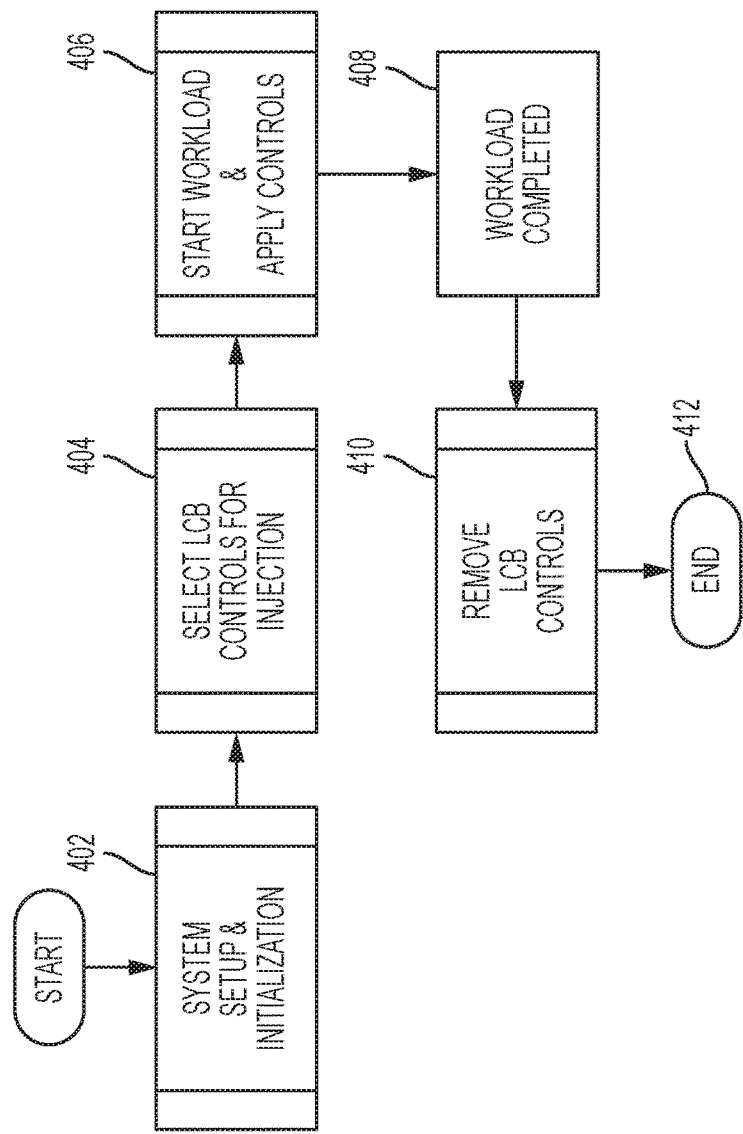
FIG. 4 depicts a flow diagram illustrating the operation of an exemplary embodiment.

A flowchart illustrating a method 400 of generating a voltage noise event is presented in FIG. 4. Method 400 is merely exemplary and is not limited to the embodiments presented herein. Method 400 can be employed in many different embodiments or examples not specifically depicted or described herein. In some embodiments, the procedures, processes, and/or activities of method 400 can be performed in the order presented. In other embodiments, one or more of the procedures, processes, and/or activities of method 400 can be combined or skipped.

In order to add noise to specific regions of an integrated circuit device, first one characterizes which noise events correspond to which LCBs (block 402). As described above, an initial characterization of an integrated circuit device can track voltage noise events through the integrated circuit device to determine any LCBs that are affected by the voltage noise event. Thereafter, an LUT can be created that maps the LCBs to their associated control signals.

In addition, one can employ a location-based method to select every LCB under the LCB controller where the event is predicted to occur (block 404). A slight change to the LCB controller logic can allow for the selection of all LCB signals.

Once one has selected which LCBs and control signals will be activated, we then apply the control signals in conjunction with the execution of the testing workload (block 406). As more circuits become active, there is more voltage noise on the power supply lines near the desired region of the integrated circuit device. The presence of the additional voltage noise allows one to aggravate selected regions in order to maintain a constant noise injection during a workload operation. Once the workload has been completed (block 408), the LCB controls are removed (block 410), and the process ends (block 412). The above-described techniques allow for low-noise workloads to more fully exercise the integrated circuit device to more accurately represent customer work environments.

In addition to the above-described techniques, other techniques can be used to reduce the total power consumption of an integrated circuit device. By reducing the total power consumption, voltage noise events are also reduced. Exemplary methods of reducing total power consumption includes disabling optional logic, such as turning off branch prediction, using clock gating (also known as disact), spreading out emulation, and the like.

Figure 5:
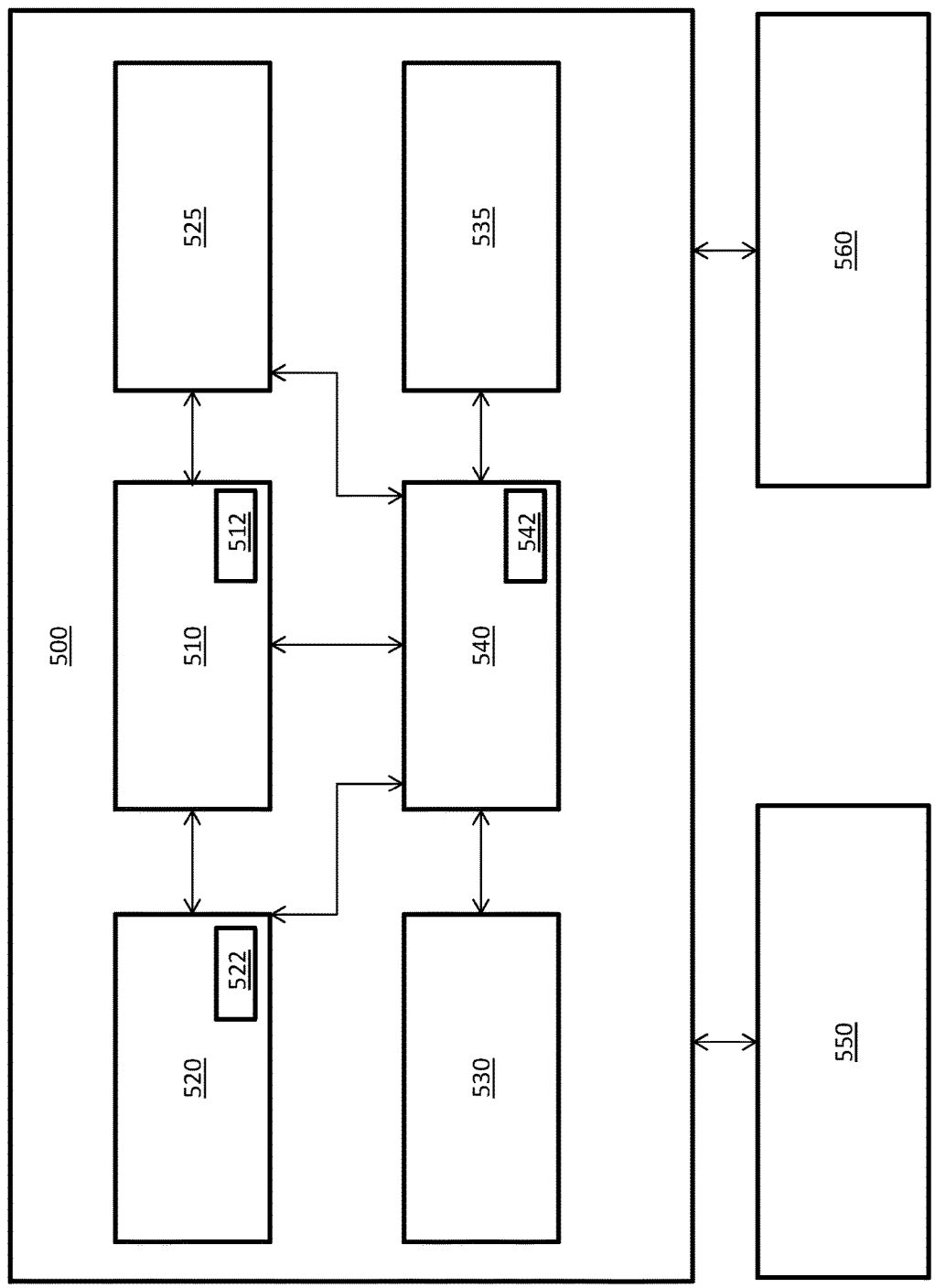
FIG. 5 illustrates a block diagram of one or more exemplary embodiments.

FIG. 5 presents a block diagram illustrating a portion of an integrated circuit capable of performing embodiments of the invention. While FIG. 5 only illustrates two LCBs, as described above, an integrated circuit can have thousands of LCBs, so elements of FIG. 5 can be scaled appropriately.

FIG. 5 illustrates a portion of integrated circuit 500. Integrated circuit 500 includes a detector 510, a first selector 520, a second selector 525, a first LCB 530, a second LCB 535, and a dampener 540. Coupled to integrated circuit 500 are an analyzer 550 and a predictor 560. Detector 510 is arranged to detect the presence of a voltage noise event within integrated circuit 500. Detector 510 can use one of a variety of different techniques to perform such a detection. For example, detector 510 can include a voltage thermometer 512 to perform detection functions. Other techniques also can be used.

First selector 520 is arranged to select an LCB (such as LCB 530 or LCB 535) for dampening via dampener 540. First selector 520 can use one of a variety of techniques, such as the use of a look-up table 522, to perform the selection. Dampener 540 can be used to perform dampening functions. For example, a latched scan out 542 can be toggled. Second selector 525 can be used to select a dampening function to be used by dampener 540.

In some embodiments, analyzer 550 and predictor 560 can be external to integrated circuit 500 and can be used to perform an analysis of incoming instructions, such as described above with respect to block 302. In other embodiments, analyzer 550 and predictor 560 can be internal to integrated circuit 500. Based on the analysis, a prediction of an occurrence of a noise event in a manner can be made in a manner such as described above with respect to block 304.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The descriptions presented herein are for purposes of illustration and description, but is not intended to be exhaustive or limited. Many modifications and variations will be apparent to those of ordinary skill in the art without departing from the scope and spirit of embodiments of the invention. The embodiment was chosen and described in order to best explain the principles of operation and the practical application, and to enable others of ordinary skill in the art to understand embodiments of the present invention for various embodiments with various modifications as are suited to the particular use contemplated.

What is claimed is:

1. A method of mitigating voltage noise events in an integrated circuit device, the method comprising:
   detecting a presence of a voltage noise event at the integrated circuit device;
   selecting a local clock buffer (LCB) for dampening;
   selecting a type of dampening for the LCB; and
   applying the type of dampening to the LCB while the voltage noise event is occurring.

2. The method of claim 1, further comprising removing the LCB dampening after the voltage noise event ceases.

3. The method of claim 1, wherein detecting the presence of a noise event comprises:
   using a voltage thermometer circuit to determine that a reduction in voltage exists in a region of the integrated circuit device.

4. The method of claim 1, further comprising:
analyzing instructions being provided to the integrated circuit device;
predicting a future presence of a voltage noise event based on the analyzing; wherein:
the selecting and applying steps occur subsequent to predicting the future presence of the voltage noise event and prior to detecting the voltage noise event.

5. The method of claim 4, wherein applying the type of dampening to the LCB occurs subsequent to detecting the voltage noise event.

6. The method of claim 1, wherein selecting the LCB for dampening comprises:
analyzing the voltage noise event; and
consulting a look-up table to select the LCB based on the analyzing.

7. The method of claim 1, wherein selecting the LCB for dampening comprises:
determining a clock controller where the voltage noise event is occurring; and
selecting each LCB being controlled by the clock controller.

8. The method of claim 1, wherein selecting the type of dampening comprises:
decoupling L1 and L2 controls from the LCB to allow non-functional switching of the L1 and L2 controls; and
allowing the voltage noise event to traverse through the LCB to open a pathway for the voltage noise event to dissipate.

9. The method of claim 1, wherein selecting the type of dampening comprises:
choosing from the selection comprising: toggling a latched scan-out and using a gated device on a scan out chain; and
using the selected dampening to open a pathway for the voltage noise event to dissipate.

10. An integrated circuit device arranged to mitigate voltage noise events, comprising:
a detector arranged to detect a presence of a voltage noise event at the integrated circuit device;
a first selector arranged to select a local clock buffer (LCB) for dampening;
a second selector arranged to select a type of dampening for the LCB; and
a dampener arranged to apply the dampening to the LCB while the voltage noise event is occurring.

11. The integrated circuit device of claim 10, wherein the dampener is further arranged to remove the LCB dampening after the voltage noise event ceases.

12. The integrated circuit device of claim 10, wherein the detector is arranged to:
use a voltage thermometer circuit to determine that a reduction in voltage exists in a region of the integrated circuit device.

13. The integrated circuit device of claim 10, further comprising:
an analyzer arranged to analyze instructions being provided to the integrated circuit device;
a predictor arranged to predict a future presence of a voltage noise event based on the analyzing; wherein:
the selecting and applying steps occur subsequent to predicting the future presence of the voltage noise event and prior to detecting the voltage noise event.

14. The integrated circuit device of claim 13, wherein the dampener is arranged to apply the dampening to the LCB subsequent to detecting the voltage noise event.

15. The integrated circuit device of claim 10, wherein the first selector is arranged to:
analyze the voltage noise event; and
consult a look-up table to select the LCB based on the analyzing.

16. The integrated circuit device of claim 10, wherein the first selector is arranged to:
determine a clock controller where the voltage noise event is occurring; and
select each LCB being controlled by the clock controller.

17. The integrated circuit device of claim 10, wherein the second selector is arranged to:
decouple L1 and L2 controls from the LCB to allow non-functional switching of the L1 and L2 controls; and
allow the voltage noise event to traverse through the LCB to open a pathway for the voltage noise event to dissipate.

18. The integrated circuit device of claim 10, wherein the second selector is arranged to:
choose from the selection comprising: toggling a latched scan-out and using a gated device on a scan out chain; and
use the selected dampening to open a pathway for the voltage noise event to dissipate.

19. A method for generating voltage noise events in an integrated circuit device comprising:
characterizing the integrated circuit device to determine regions of the integrated circuit device that are affected by each local clock buffer (LCB) in the integrated circuit device;
selecting an LCB; and
generating a voltage noise event to the selected LCB by applying control signals to the selected LCB.

20. The method of claim 19 further comprising:
performing a workload on the integrated circuit device to determine an effect of the voltage noise event.

* * * * *